US009634702B2

(12) United States Patent
Jabbour et al.

(10) Patent No.: US 9,634,702 B2
(45) Date of Patent: Apr. 25, 2017

(54) MULTIBAND FILTER FOR NON-CONTIGUOUS CHANNEL AGGREGATION

(71) Applicant: Nokia Technologies Oy, Espoo (FI)

(72) Inventors: Chadi Jabbour, Berkeley, CA (US); Sudhir Aggarwal, Fremont, CA (US); Vason P. Srini, Berkeley, CA (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/931,687

(22) Filed: Nov. 3, 2015

(65) Prior Publication Data

US 2016/0322996 A1    Nov. 3, 2016

Related U.S. Application Data

(60) Provisional application No. 62/155,423, filed on Apr. 30, 2015.

(51) Int. Cl.
*H04B 1/10* (2006.01)
*H03H 19/00* (2006.01)

(52) U.S. Cl.
CPC ......... *H04B 1/1036* (2013.01); *H03H 19/002* (2013.01); *H03H 19/008* (2013.01);
(Continued)

(58) Field of Classification Search
CPC .. H04B 1/1036; H04B 1/1081; H03H 19/002; H03H 19/008; H03H 2240/00; H03H 2250/00
(Continued)

(56) References Cited

U.S. PATENT DOCUMENTS

| 6,020,783 | A | 2/2000 | Coppola |
| 2013/0335163 | A1* | 12/2013 | Aggarwal ............ H03H 19/002 333/132 |
| 2016/0269042 | A1 | 9/2016 | Jabbour et al. |

FOREIGN PATENT DOCUMENTS

GB    2500067 A    9/2013

OTHER PUBLICATIONS

Gomez-Garcia et al., "Microwave multi-path dual-passband filters for wide-band applications," in European Microwave Conference EuMC, 2009.
(Continued)

*Primary Examiner* — Phuong Phu
(74) *Attorney, Agent, or Firm* — Mintz Levin Cohn Ferris Glovsky and Popeo, P.C.

(57) ABSTRACT

Methods and apparatus, including computer program products, are provided for receivers. In one aspect there is provided an apparatus. In some example embodiments, there is provided an apparatus. The apparatus may include a first N-path filter configured with at least a first passband, wherein the first N-path filter is coupled to a radio frequency input port providing at least a first carrier aggregation signal, a second carrier aggregation signal, and an interfering signal; a second N-path filter configured with at least a second passband, wherein the second N-path filter is coupled to the radio frequency input port providing at least the first carrier aggregation signal, the second carrier aggregation signal, and the interfering signal; and a combiner configured to subtract a first output of the first N-path filter from a second output of the second N-path filter. Related apparatus, systems, methods, and articles are also described.

20 Claims, 21 Drawing Sheets

(52) U.S. Cl.
CPC ....... *H04B 1/1081* (2013.01); *H03H 2240/00* (2013.01); *H03H 2250/00* (2013.01)

(58) Field of Classification Search
USPC .......................................... 375/350; 333/132
See application file for complete search history.

(56) References Cited

OTHER PUBLICATIONS

Elmaghraby et al., "A Double Bandpass N-path filter for LTE Carrier Aggregation Receivers in 28nm CMOS," in IEEE Wireless and Microwave Technology Conference (WAMICON), 2014.

Darvishi et al., A 0.3GHz to 1.2GHz tunable 4th order switched gm-C Band-Pass Filter with >55dB Ultimate Rejection and out-of-band IIP3 of +29dBm. University of Twente, Enschede, the Netherlands. 2012.

Darvishi et al., Widely Tunable 4th Order Switched G $ m$-C Band-Pass Filter Based on N-Path Filters. IEEE J of Solid-State Circuits, IEEE Service Center. Dec. 2012:47;3105-19.

\* cited by examiner

MULTIBAND FILTER FOR NON-CONTIGUOUS CHANNEL AGGREGATION

CROSS-REFERENCE TO RELATED APPLICATIONS

This application claims the benefit of U.S. provisional patent application Ser. No. 62/155,423, filed on Apr. 30, 2015 and entitled "MULTIBAND FILTER FOR NON-CONTIGUOUS CHANNEL AGGREGATION" which is incorporated by reference herein in its entirety.

STATEMENT OF GOVERNMENT SPONSORED SUPPORT

This invention was made with Government support under Agreement No. HR0011-12-9-0013, awarded by DARPA. The Government has certain rights in the invention.

FIELD

The subject matter disclosed herein relates to wireless communications.

BACKGROUND

A user equipment, such as a mobile wireless devices and the like, may be mobile in the sense that it may enter and/or exit a plurality of cells that serve the user equipment with access to and from the public land mobile network. For example, when the user equipment enters a cell, the network may send a command to the user equipment to perform a handover to that cell in order to couple to the serving cell. The user equipment may then proceed to be configured to measure the serving cell and/or other cells, report measurements of the serving cell and/or other cells to the network, and the like. After having executed the handover, the user equipment may become operational on the serving cell and thus user data can flow to and from the network.

Some user equipment may be configured to operate using carrier aggregation. Carrier aggregation refers to using one or more portions of the radio frequency spectrum (also referred to as spectrum chunks, bands, or frequencies) to carry data between the user equipment and the network— increasing thus data throughput, when activated by the network. These spectrum chunks may be contiguous or non-contiguous and may be symmetric or asymmetric (for example, a different quantity of spectrum chunks allocated to the uplink and downlink). Typically, one of the spectrum chunks is designated a primary cell, serving as an anchor carrier, while one or more additional spectrum chunks are referred to as secondary cells (Scells).

SUMMARY

Methods and apparatus, including computer program products, are provided for receivers.

In some example embodiments, there is provided an apparatus. The apparatus may include a first N-path filter configured with at least a first passband, wherein the first N-path filter is coupled to a radio frequency input port providing at least a first carrier aggregation signal, a second carrier aggregation signal, and an interfering signal; a second N-path filter configured with at least a second passband, wherein the second N-path filter is coupled to the radio frequency input port providing at least the first carrier aggregation signal, the second carrier aggregation signal, and the interfering signal; and a combiner configured to subtract a first output of the first N-path filter from a second output of the second N-path filter.

In some example embodiments, one of more variations may be made as well as described in the detailed description below and/or as described in the following features. The apparatus may further include a receiver configured to receive the combiner output. The apparatus may further include at least one of a clock or a local oscillator coupled to the first N-path filter and the second N-path filter. The apparatus may be included in a user equipment. The radio frequency input port may be configured to receive at least a down converted signal at an intermediate frequency. The apparatus may further include a controller configured to vary at least one of a first capacitor coupled to a first N-path filter output or a second capacitor coupled to a second N-path filter output. The varying of the first capacitor may vary a bandwidth of the first N-path filter. The controller may be further configured to vary a clock frequency of at least one of the first N-path filter or the second N-path filter. The varying of the clock frequency may vary a center frequency at least one of the first passband of the first N-path filter or the second passband of the second N-path filter. The first carrier aggregation signal may include a primary cell carrier. The second carrier aggregation signal may include a secondary cell carrier. The first and second carrier aggregation signals may be non-contiguous.

It is to be understood that both the foregoing general description and the following detailed description are exemplary and explanatory only and are not restrictive. Further features and/or variations may be provided in addition to those set forth herein. For example, the implementations described herein may be directed to various combinations and subcombinations of the disclosed features and/or combinations and subcombinations of several further features disclosed below in the detailed description.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the subject matter disclosed herein. In the drawings.

Figure 1:
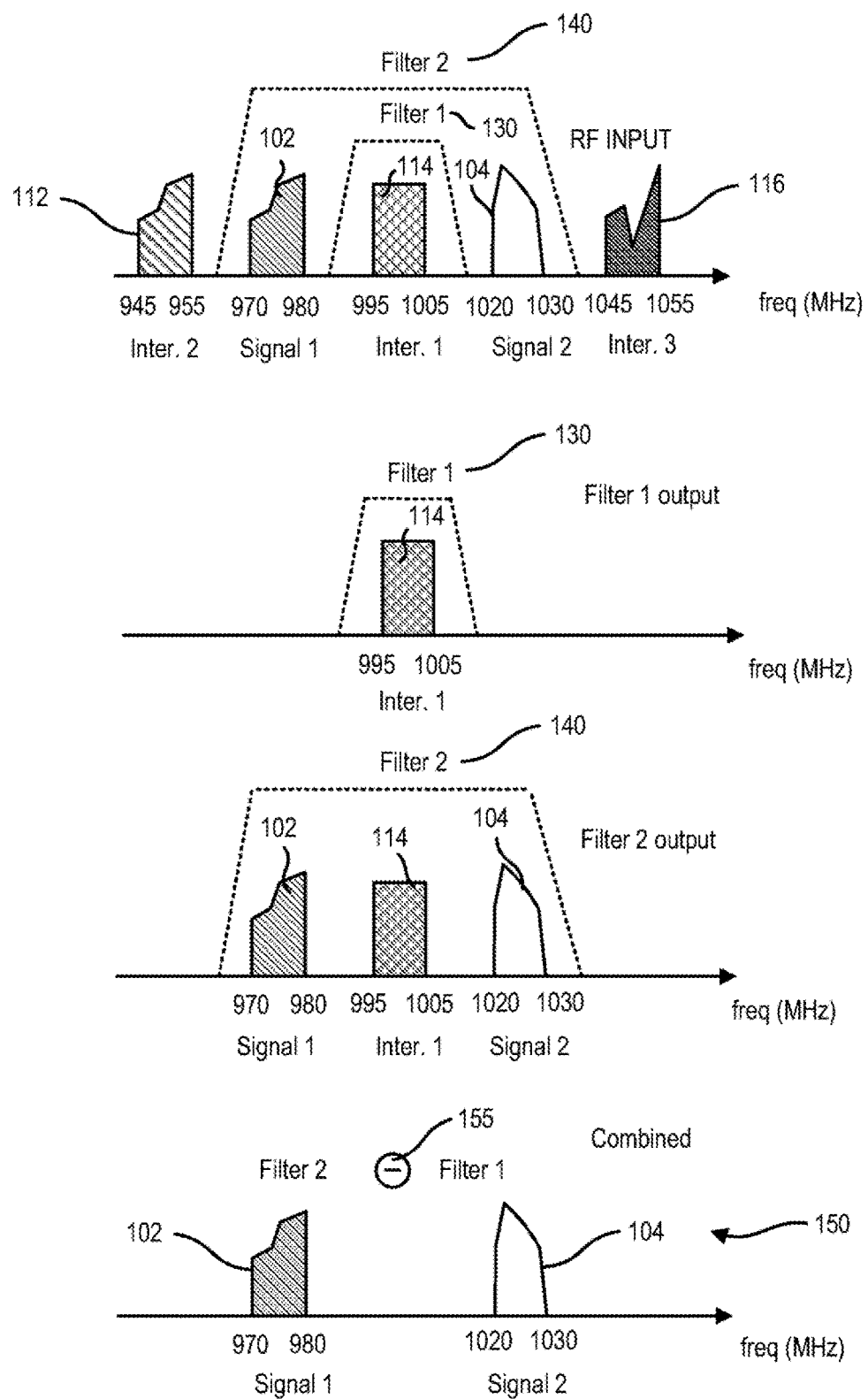
FIG. 1 depicts examples of frequency response plots of the received signal for the apparatus, in accordance with some example embodiments.

Like labels are used to refer to same or similar items in the drawings.

DETAILED DESCRIPTION

When multiple cellular receivers, at a given user equipment or node, are used to receive multiband signals in for example carrier aggregation, the use of multiple cellular receivers makes the system relatively costly, bulky, and power inefficient, especially in the case of mobile wireless communication systems.

In some example embodiments, multi-bandpass filtering is provided. The multi-bandpass filter may be configured to enable contiguous as well as non-contiguous carrier aggregation, although the multi-bandpass filtering disclosed herein may be used in other types of carriers as well.

In some example embodiments, a plurality of N-path filters are configured in parallel to provide multi-band filtering. Some, if not all of, the N-path filters may be clocked at a certain frequency (for example, by a common clock or local oscillator). By adjusting the bandwidth of one or more of the N-path filters (by an appropriate combination of their components) and combining the output in a controlled way (for example, using a subtractor circuit and/or the like), the desired transfer function may be obtained for the apparatus including the plurality of N-path filters to pass the signals of interest and/or reject adjacent interfering signals.

FIG. 1 plots examples of frequency responses for an apparatus including a plurality of N-path filters 130 and 140, in accordance with some example embodiments. The N-path filters 130 and 140 may, in some example embodiments, be clocked with the same frequency (for example using a common clock or local oscillator).

Suppose several non-contiguous bands include a first signal 102 and a second signal 104. In the example of FIG. 1, signals 102 and 104 may represent carrier aggregation signals that a receiver may need to process. Moreover, these signals 102 and 104 may be adjacent to interfering signals 112-116. Attenuating interfering signals 112 and 116 may be performed using a bandpass filter centered at 1 GHz with a passband of ±30 MHz. Attenuating the first interfering signal 114 may, however, be considered more of a challenge as it is positioned between the two signals 102 and 104 of interest.

In some example embodiments, a plurality of N-path filters are provided to suppress the interfering signals 112-116 while passing the signals 102-104 of interest. In the example of FIG. 1, two N-path filters may be centered around a central frequency (of 1 GHz in this example). FIG. 1 shows the frequency response of the first N-path filter 130, in accordance with some example embodiments. The first N-path filter 130 may be configured to have sufficient bandwidth (±5 MHz in this example) to handle the first interfering signal 114. And, the second N-path filter 140 may be configured to have sufficient bandwidth (±30 MHz in this example) to cover the passband of the signals 102-104 of interest. When the RF input (which includes signals of interest 102 and 104 and interfering signals (112-116) is provided as an input to filters 130 and 140, the first filter 130 may suppress (or attenuate) those signals outside the passband. The second filter 140 may suppress (or attenuate) those signals outside of the passband, so that the signals 102-104 of interest remain as well as the interfering signal 114. The outputs of the first filter 130 and the second filter 140 may be further processed to remove the interfering signal 114. For example, the output of the first filter 130 may be subtracted (for example, with a combiner) from the output of the second filter 140 to yield the signals 102-104 of interest (without the interfering signal 114) as shown at 150.

Figure 2:
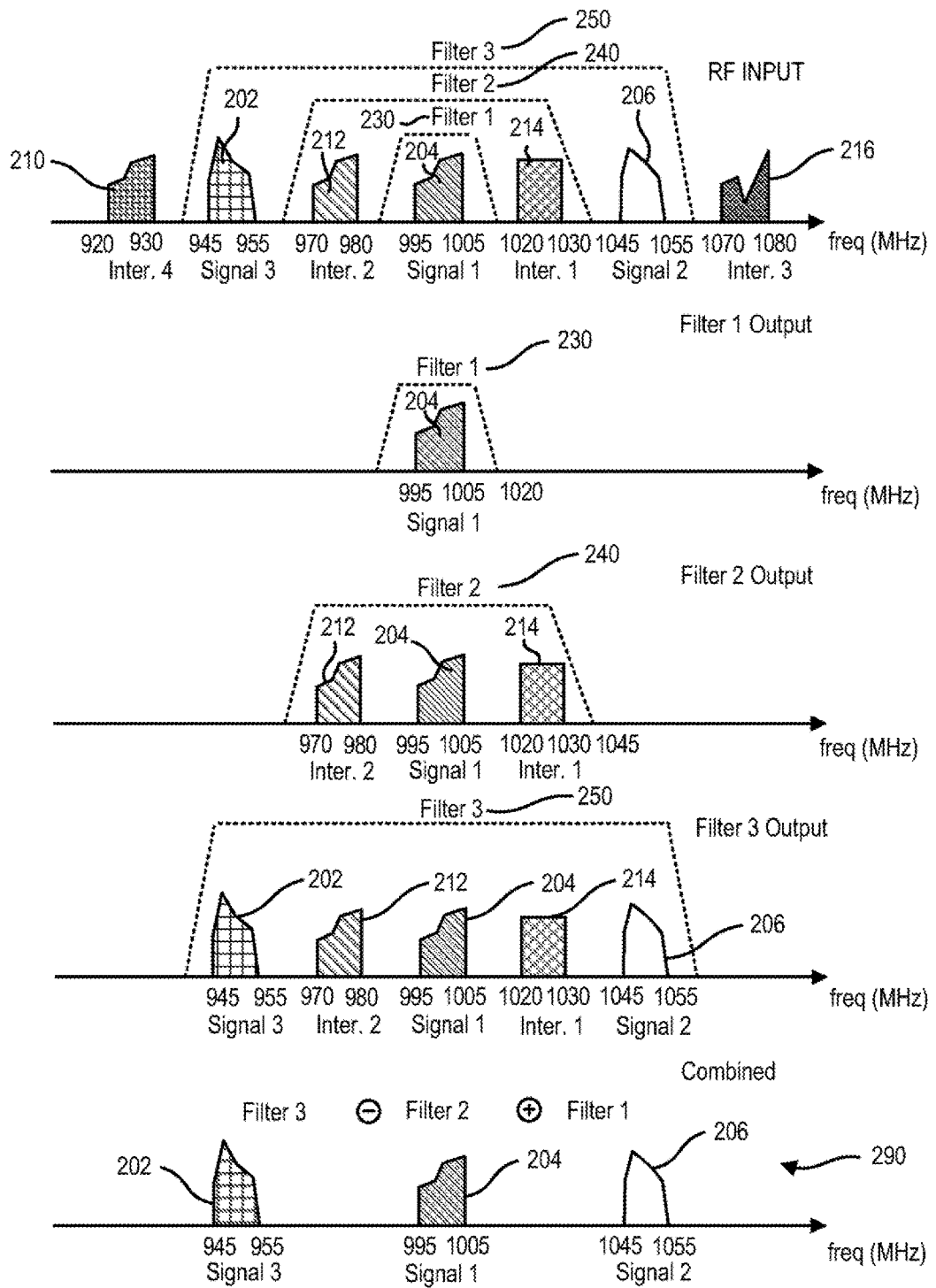
FIG. 2 depicts additional examples of frequency response plots of the received signal for the apparatus, in accordance with some example embodiments.

FIG. 2 plots examples of frequency responses for an apparatus including a plurality of N-path filters 230, 240, and 250, in accordance with some example embodiments. The N-path filters 230-250 may, in some example embodiments, be clocked with the same frequency (for example using a common clock or local oscillator). Without in any way limiting the scope, interpretation, or application of the claims appearing herein, a technical effect is having low-complexity clock generation (for example, a single local oscillator may be used to drive all of the N-path filters 230-250).

In the example of FIG. 2, there are three signals 202, 204, and 206 of interest. These signals may be carrier aggregation signals, such as a primary carrier and two secondary cell carriers. The adjacent interfering signals are at 210, 212, 214, and 216. In the example of FIG. 2, the three N-path filters may be centered around a central frequency (of 1 GHz in this example). The frequency response of the first N-path filter 230 may be configured to have sufficient bandwidth (±5 MHz in this example) to pass the first signal of interest 204. The second N-path filter 240 may be configured to have sufficient bandwidth (±30 MHz in this example) to pass interfering signals 212 and 214 as well as signal of interest 204. The third N-path filter 250 may be configured to have sufficient bandwidth (±55 MHz in this example) to cover interfering signals 212 and 214 as well as signal of interest 202, 204, and 206. When the RF input (which includes signals 202-206 and interfering signals 212-116) is provided as an input to filters 230, 240, and 250, the first filter 230 may suppress (or attenuate) those signals outside the passband, so that the signal of interest 204 remains. The second filter 240 may suppresses (or attenuate) those signals outside of the passband, so that the signal 204 of interest remains as well as the interfering signals 212 and 214. The third filter 250 may suppress (or attenuate) those signals outside of the passband, so that the signals 202-206 of interest remain as well as the interfering signals 212 and 214. The outputs of the first filter 230, second filter 240, and third filter 250 may be further processed. In the example of FIG. 2, the signal processing may provide a combiner having the following form:

Combined=Filter 3−Filter 2+Filter 1.

As such, the combiner output, as shown at 290, includes the three signals of interest 202, 204, and 206. Although FIG. 1 depicts two signals of interest and a single adjacent interferer while FIG. 2 depicts 3 signals of interest and 3 interferers, other quantities of signals of interest and interferers may be processed by the apparatus (which includes a plurality of N-path filters and a combiner), in accordance with some example embodiments.

Figure 3:
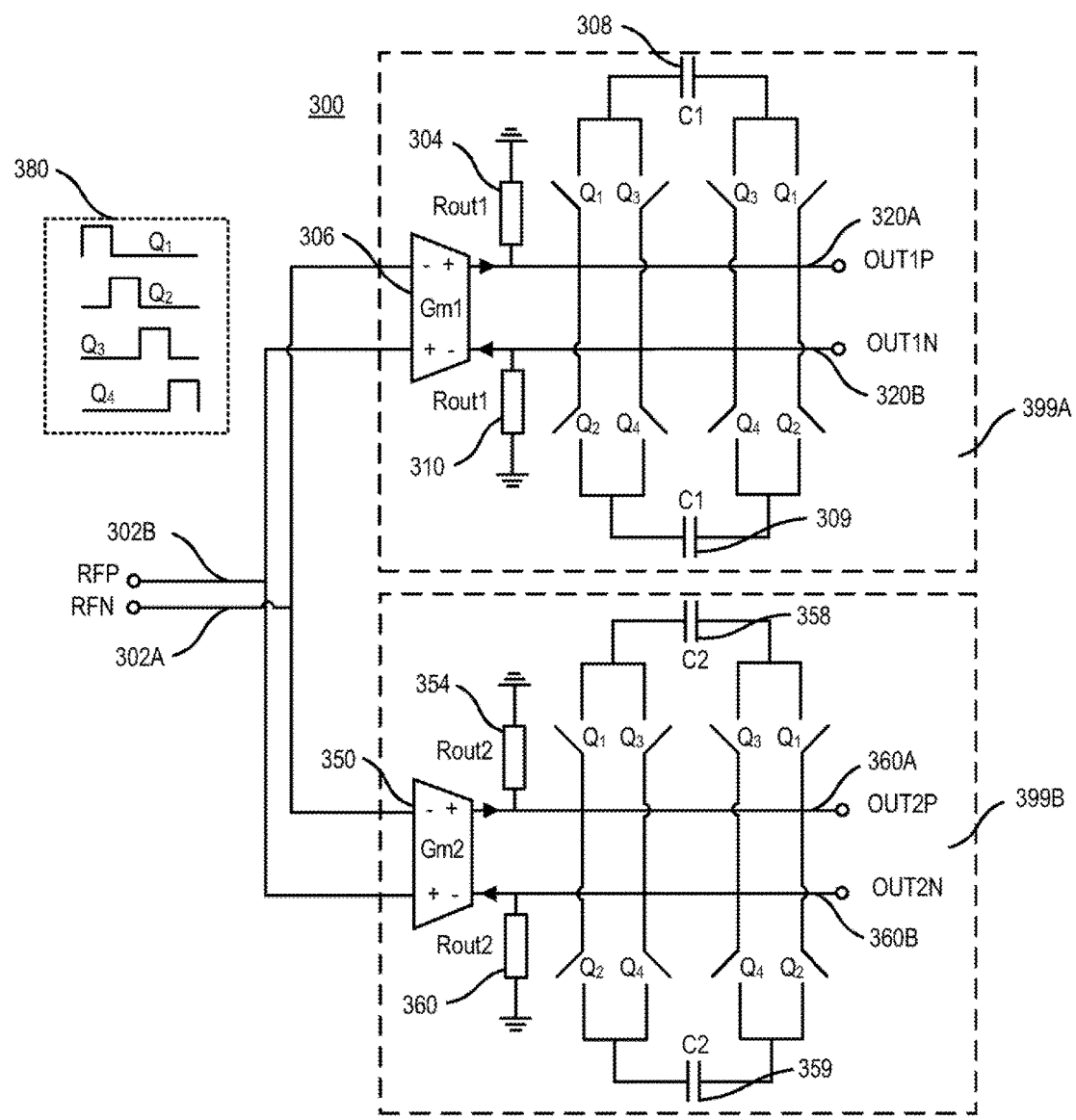
FIG. 3 depicts an example of an apparatus including two N-path filters for processing signals including carrier aggregation signals and adjacent interfering signals, in accordance with some example embodiments.

FIG. 3 depicts an apparatus 300 including a plurality of N-path filters 399A and 399B, in accordance with some example embodiments. Although FIG. 3 depicts two N-path filters, other quantities of N-path filters may be configured in parallel to process signals of interest and/or interfering signals, in accordance with some example embodiments. Although FIG. 3 depicts first order transconductance, Gm-C N-path filters, other types of N-path filters, such as resistive-capacitive N-path filters and higher-order N-path filters may be used as well.

In the example of apparatus 300, a radio frequency (RF) input 302A-B may be provided to each of the plurality of N-path filters 399A and 399B. The RF inputs 302A-B may correspond to for example the RF inputs depicted at FIG. 1 and may include signals of interest (for example, carrier aggregation signals, although other signal types may be used) and/or adjacent interferers 112, 114, and 116.

Although FIG. 3 depicts a dual or differential signal input at 302A-B, a single-ended RF input may be used as well. Moreover, although the RF signal 302A-B may represent the signals of interest at transmitted RF frequencies, the input RF signal may, in some example embodiments, undergo some down conversion to lower frequencies as well.

In the example embodiment, the first N-path filter 399A may comprise a transconductance-capacitance (Gm-C) type N-path filter, although other types of high Q type filters may be used as well. The first N-path filter 399A may include a transconductance amplifier 306 having inputs coupled to the RF input 302A-B. The transconductance amplifier output resistance is represented by Rout1 304 and 310. The positive output of the transconductance amplifier 306 may be coupled to a first capacitor 308 through at least one switch (labeled $\Phi_1$) of switch matrix $\Phi_1$-$\Phi_4$ (although other quantities of phases and/or switches may be used as well). The other output of the transconductance amplifier 306 may also be coupled to a second capacitor 309 through at least one switch of switch matrix $\Phi_1$-$\Phi_4$. The differential output of the first N-path filter 399A may be provided at 320A-B.

FIG. 3 also depicts a timing diagram 380. The timing diagram shows when each of the switches $\Phi_1$-$\Phi_4$ is closed. For example, during time $\Phi_1$ (for example, a first pulse of the local oscillator), the switches labeled $\Phi_1$ may be closed; during time $\Phi_2$ (for example, the next pulse of the local oscillator), the switches labeled $\Phi_2$ may be closed; and so forth.

In the example embodiment of FIG. 3, the second N-path filter 399B may comprise a transconductance-capacitance (Gm-C) type N-path filter as well. The second N-path filter 399B may include a transconductance amplifier 350 having inputs coupled to the RF input 302A-B. The transconductance amplifier output resistance is represented by Rout2 354 and 360. The negative output of the transconductance amplifier 306 may also be coupled to a first capacitor 358 through at least one switch (labeled $\Phi_1$) of switch matrix $\Phi_1$-$\Phi_4$. The other output of the transconductance amplifier 350 may also be coupled to a second capacitor 359 through at least one switch of switch matrix $\Phi_1$-$\Phi_4$. The differential output of the second N-path filter 399B is provided at 320A-B.

In some example embodiments, a controller may adjust the center frequency of the first N-path filter 399A and the second N-path filter 399B by varying the clock frequency (or local oscillator). To tune the N-path filters to a given center frequency (as shown in FIGS. 1 and 2), the clock frequency to each of the N-path filter may be varied by the controller. In some example embodiments, a single clock frequency (or local oscillator) is varied and provided to the N-path filters.

The output resistances, Rout1 304 and 310, and output resistances, Rout2 354 and 360, may represent the output resistances of transconductances Gm1 and Gm2 for 306 and 350. The filter 399A and 399B bandwidths may be configured in accordance to the values of Rout and the capacitance (C). For example, the value of output resistance, Rout1 304 and 310, multiplied by the value of capacitor, C1 308 and 309, may configure the bandwidth of N-path filter 399A; the value of Rout2 354 and 360 multiplied by the value of C2 358 and 359 may configure the bandwidth of N-path filter 399B. The filter gain may be configured as a function of Gm and Rout. For example, the filter 399A gain may be configured by as a function of Gm1 and Rout1 304/310, and the filter 399B gain configured by as a function of Gm2 and Rout2 354/360.

In some example embodiments, the transfer function of each of filters 399A-B may be in accordance with the following equation:

$$H(j\omega) = \frac{N}{1 + j\frac{2\pi f}{AK_i}} \qquad \text{Eqn (1)}$$

$$\left( D\frac{BK_i}{AK_i} + \frac{BK_i \cdot flo}{AK_i^2}\left(1 + e^{j\omega(1-2D)\frac{f}{flo}}\right) \cdot \left(\frac{e^{j2\pi fD \cdot \frac{f}{flo}} - e^{-\frac{AK_iD}{flo}}}{e^{ju\frac{f}{flo}} + e^{-\frac{AK_iD}{flo}}}\right) \cdot \left(\frac{1}{1 + j\frac{2\pi f}{AK_i}}\right) \right),$$

wherein $AK_i = \frac{1}{Rout_i C_i}$, $BK_i = \frac{Gm_i}{C_i}$,

N is the number of paths in the N-path filter (4 in the example of FIG. 3), D is the ratio between one phase and the local oscillator period (which in this example is 0.25), and flo is the local oscillator frequency.

To illustrate by way of an example, the following may be selected: a local oscillator frequency at 1 GHz, C1 having a value of 12.8 picofarads (pF), C2 having a value of 800 femtofarads (fF), transconductances both being equal to 10 millisiemens (mS), and the output resistances both being equal to 1 kilo-ohm (kΩ) (which results in a 20 decibel (dB) gain). When this is the case, simulations of the apparatus 300 depicted at FIG. 3 may be evaluated. The selected bandwidths for filter 399A and 399B optimize the central frequencies of the double bandpass filter at ±25 MHz offset.

Figure 4:
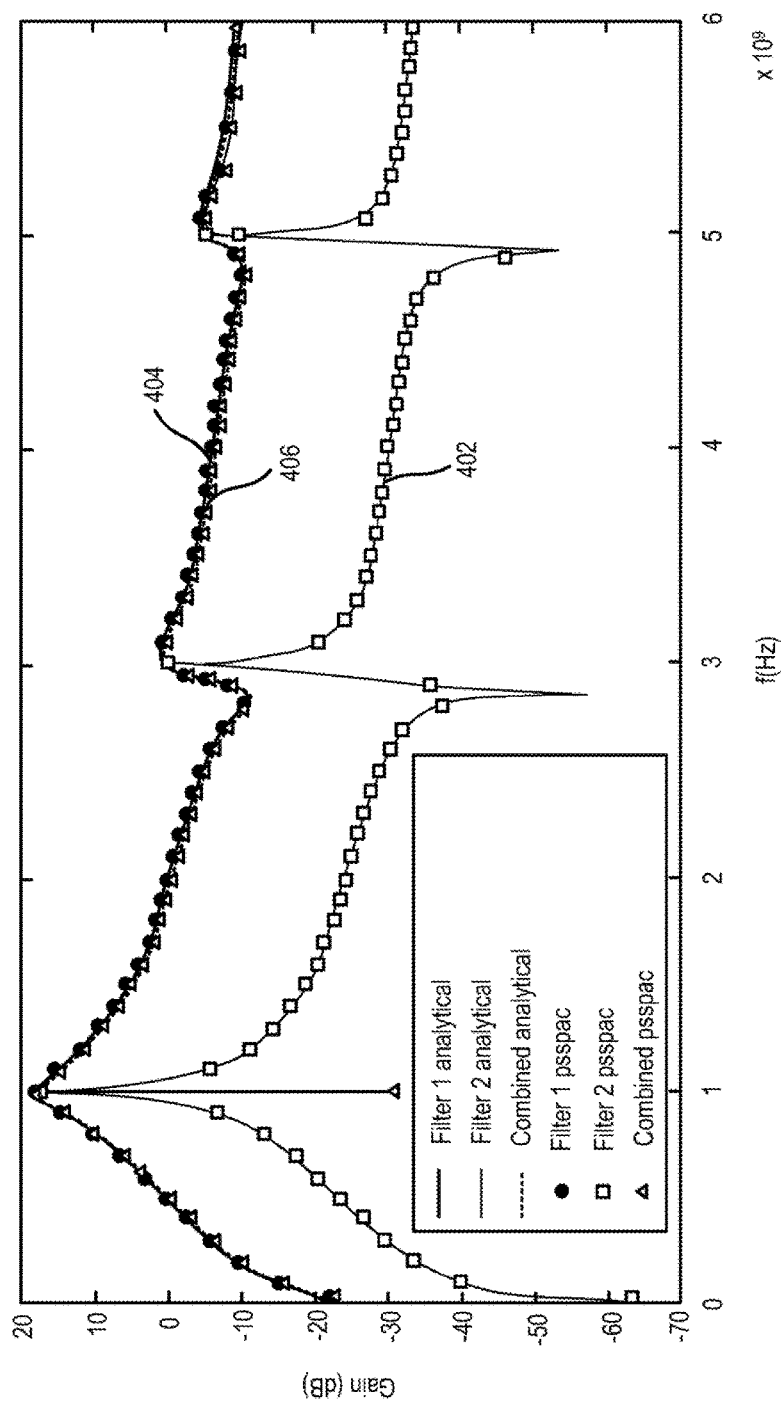
FIGS. 4-17 depict examples of simulated performance plots for the apparatus of FIG. 3, in accordance with some example embodiments.
Figure 5:
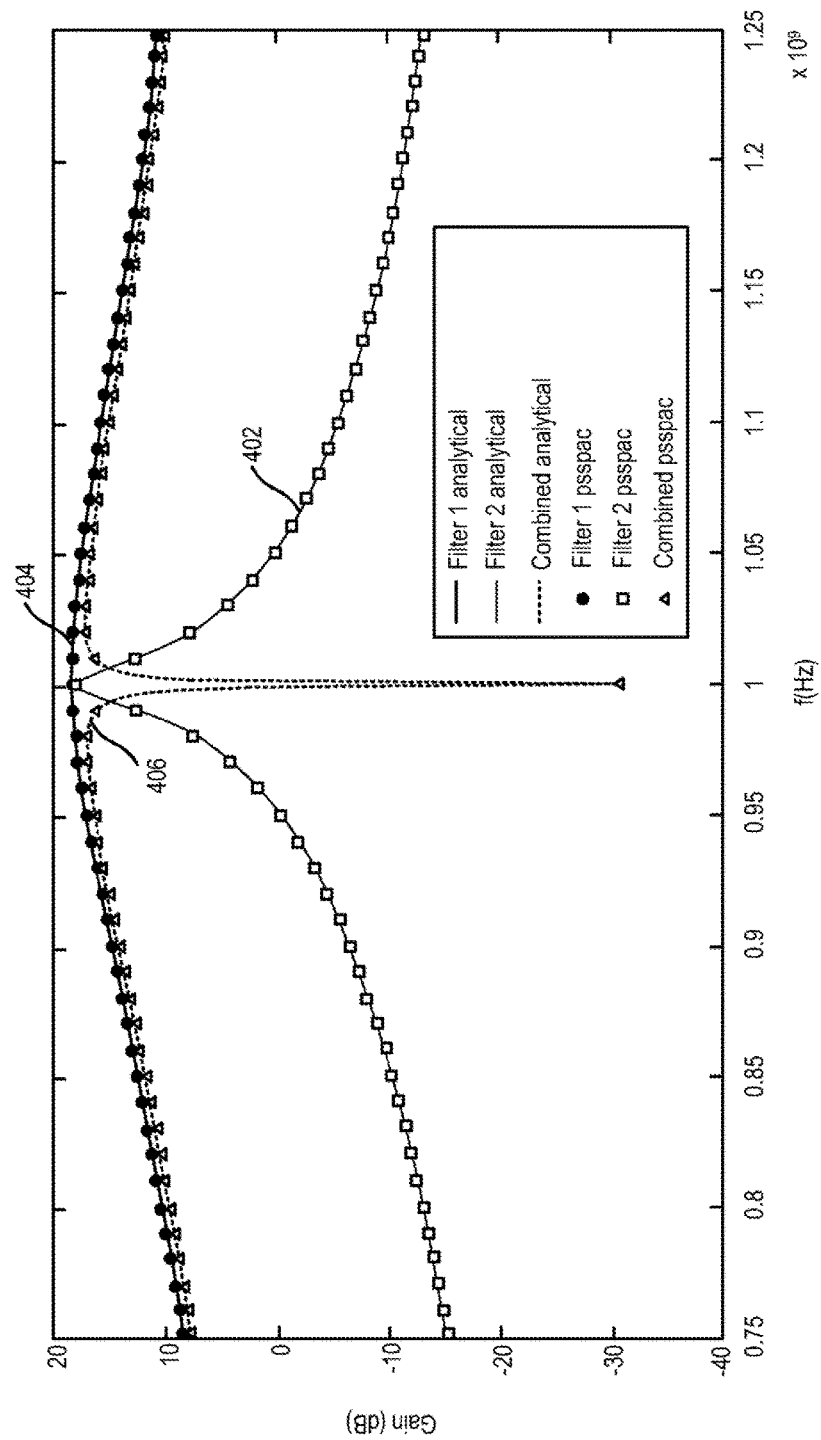
Figure 6:
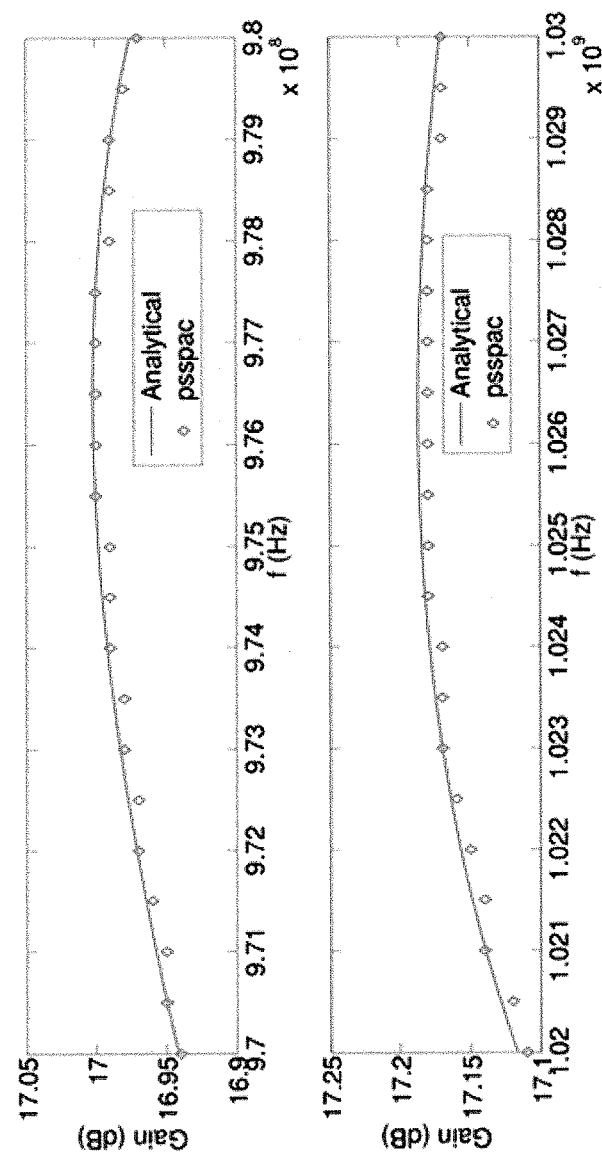

FIG. 4 depicts the transfer shows the transfer function 402 of the first filter 399A and the transfer function 404 of the second filter 399B. FIG. 5 shows a zoom (or close up view) of a portion of the plot of FIG. 4 at about the local oscillator frequency. The double bandpass behavior can be seen at FIG. 5. FIG. 6 shows a zoom around the central frequencies of the sides of the bandpass filters, which in this example is at 975 MHz and 1025 MHz. FIG. 6 shows a relatively low in-band ripple (which in this example is less than about 0.1 dB).

Although FIGS. 4-6 (as well as some of the other simulated plots) depict plots of certain simulations, these are examples of possible results for illustrative purposes as other results may be achieved as well.

To adjust the frequencies at which signals are passed or suppressed, the multi-bandpass filter's offset frequency (which corresponds to the difference between the central local oscillator frequency and the frequency of the useful signals) may, in accordance with some example embodiments, be reconfigured. The bandwidth of the N-path filters may be adjusted by a controller (although the bandwidth may be fixed as well). For example, a controller may select the capacitance of a variable capacitor/capacitor bank providing for example C1 and C2 at FIG. 3 of the N-path filters in order to change the bandwidth of each filter. The relation between the offset frequency and the bandwidths of N-path filter 399A and N-path filter 399B may be approximated by the following:

$$f_{off} \simeq \frac{1}{2}\sqrt{fb1 \cdot fb2} \qquad \text{Eqn (2)}$$

wherein the bandwidth of the filter $$fbi = \frac{1}{2\pi Rout_i C_i},$$

wherein fb1 is the bandwidth of the first filter and fb2 is the bandwidth of the second filter.

Figure 7:
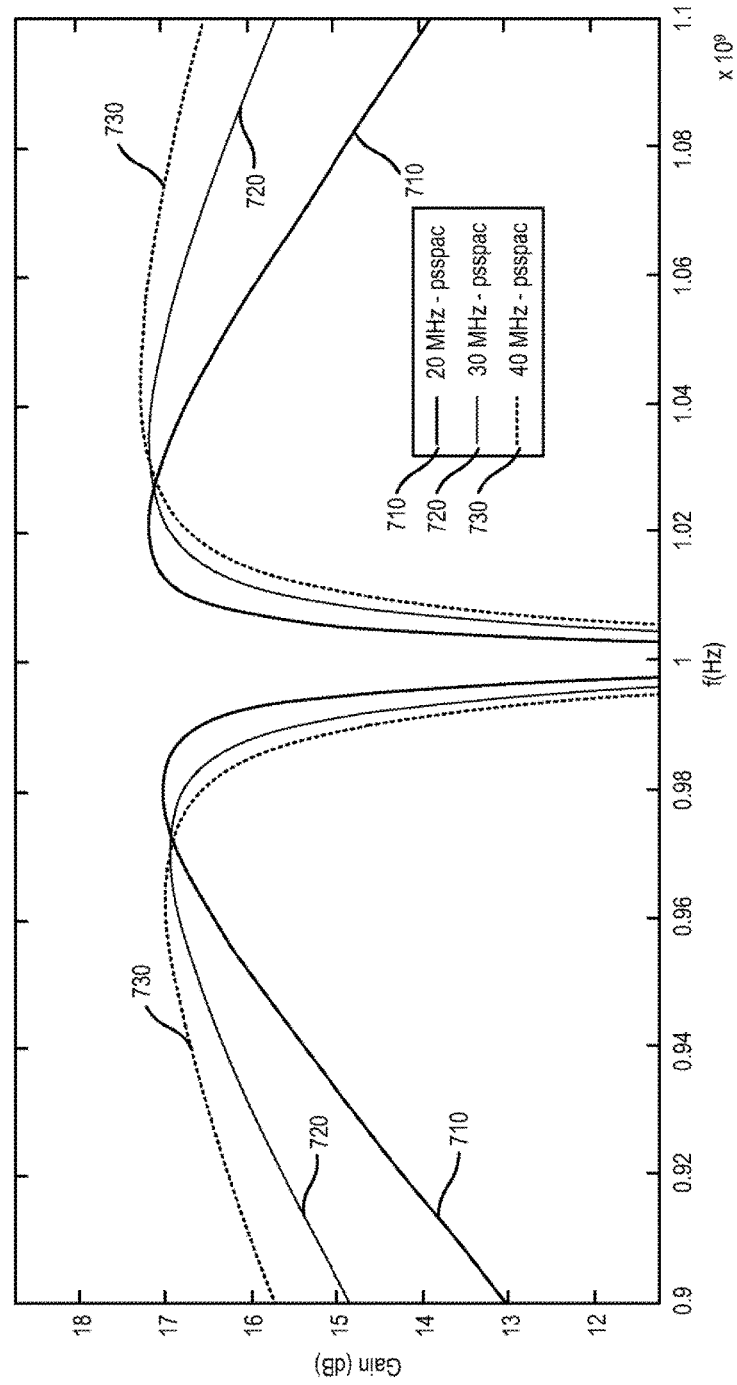

FIG. 7 shows the simulations for 3 sets of capacitors values: the first set equal to C1 308/309=16 picoFarads (pF) and C2 358/359=1 pF; the second set equal to C1=10.6 pF and C2=0.66 pF; and the third set equal to C1=8 pF and C2=0.5 pF. In the example of FIG. 7, the local oscillator frequency may be set to be equal to 1 GHz (which corresponds to the center frequency of the passbands), the transconductance at 306 and 350 may be equal and have a value 10 mS. The output resistor values 304/310 and 354/360 may be set to have equal values at 1 kΩ According to Equation (2) above, the central frequency of the apparatus 300 having double bandpass filters will be 20 MHz (see, for example, FIG. 7 at 710 for the first set of values), 30 MHz (see, for example, FIG. 7 at 720 for the second set of values), and 40 MHz (see, for example, FIG. 7 at 730 for the third set of values), as shown in FIG. 7.

A parameter that impacts the filter performance and behavior is the ratio R between the bandwidths of the filters fb2 and fb1

$$\left(R = \frac{fb2}{fb1}\right).$$

There may be a variety of combinations of fb1 and fb2, as noted above, that can be selected and configured at the double bandpass filter 300 obtain a desired offset frequency, which places the passband of each of the bandpass filters 399A-B at the proper frequency.

Figure 8:
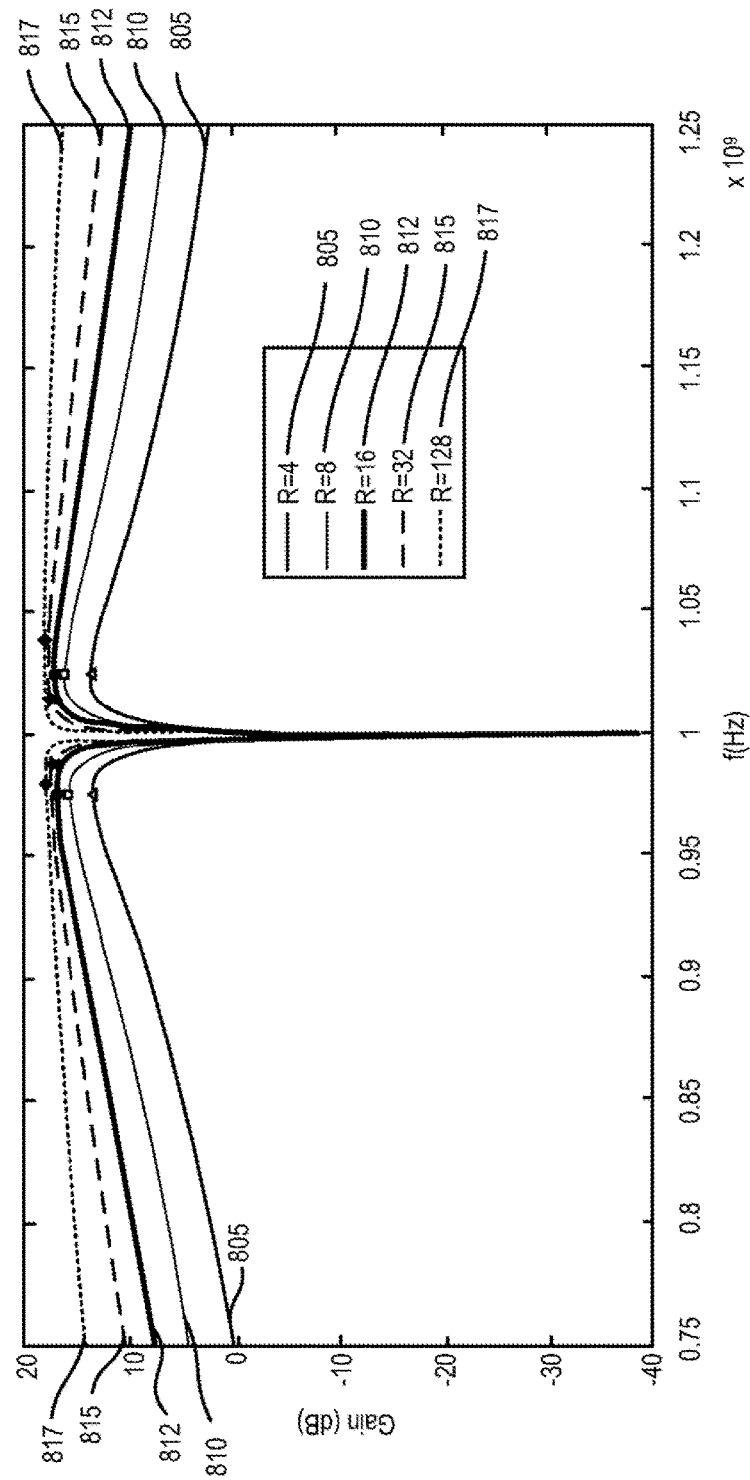

FIG. 8 shows 5 different implementations of the double bandpass filter 300 having an offset frequency of 25 MHz. The 5 values of R considered include 4 (805), 8 (810), 16 (812), 32 (815), and 128 (817) for example. As can be seen by the plots of FIG. 8, the lower the ratio R, the better the selectivity (for example, higher Q) but at the cost of a lower in-band gain. The gain value may be determined in accordance with the following approximation:

$$G \simeq G_{dc} - 20\text{Log}\left(\frac{8}{\pi^2}\right) - 20\text{Log}\left(\frac{R-1}{R+1}\right), \qquad \text{Eqn (3)}$$

wherein Gdc is the direct current (DC) gain in dB of the transconductance (20 dB in this example). The second term $$G \simeq G_{dc} - 20\text{Log}\left(\frac{8}{\pi^2}\right) - 20\text{Log}\left(\frac{R-1}{R+1}\right)$$

in Equation 3 is the gain of the N-path filter around the local oscillator frequency.

Figure 9:
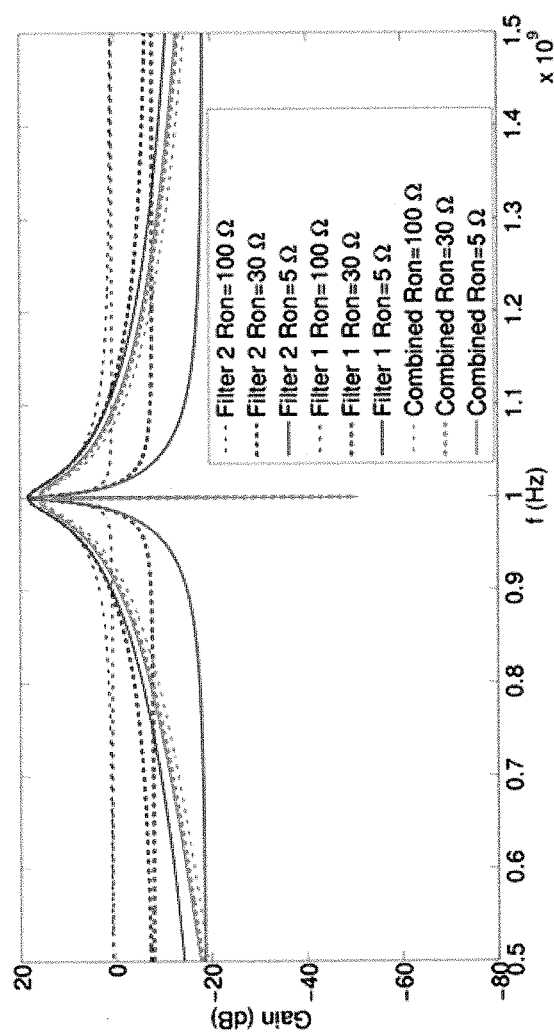

For N-path filters, a switch's ON resistance is a factor in performance. FIG. 9 depicts a variety of ON resistances for the first filter 399A and the second filter 399B. The switches (see, for example, switches labeled matrix $\Phi_1$-$\Phi_4$ at FIG. 3) have an ON resistance that maybe considered lower, when compared to switches in other types of N-path filter circuits. The out-of-band rejection of the double band filter 300 may be significantly better than a simple N-path filter. The lower ON switch resistance may be due to at least the combiner (which may for example subtract 155 the outputs of filter 399 from filter 399A) may reduce, if not eliminate, the switch ON resistance impact on the transfer function. As such, smaller switches may be used to save power. To achieve the noted ON resistance cancellation, the two filters 399A-B may need to be well-matched. As such, there may be some switch ON resistance impact on the out-of-band rejection.

Component variation may impact the behavior of the double band filter 300 disclosed herein. Table 1 below shows example values of various parameters.

TABLE 1

| Gm1 | Gm2 | Cout1 | Cout2 | Rout1 | Rout2 | $f_{off}$ | flo |
|---|---|---|---|---|---|---|---|
| 10 mS | 10 mS | 12.8 pF | 0.8 pF | 1 kΩ | 1 kΩ | 25 MHz | 1 GHz |

Figure 10:
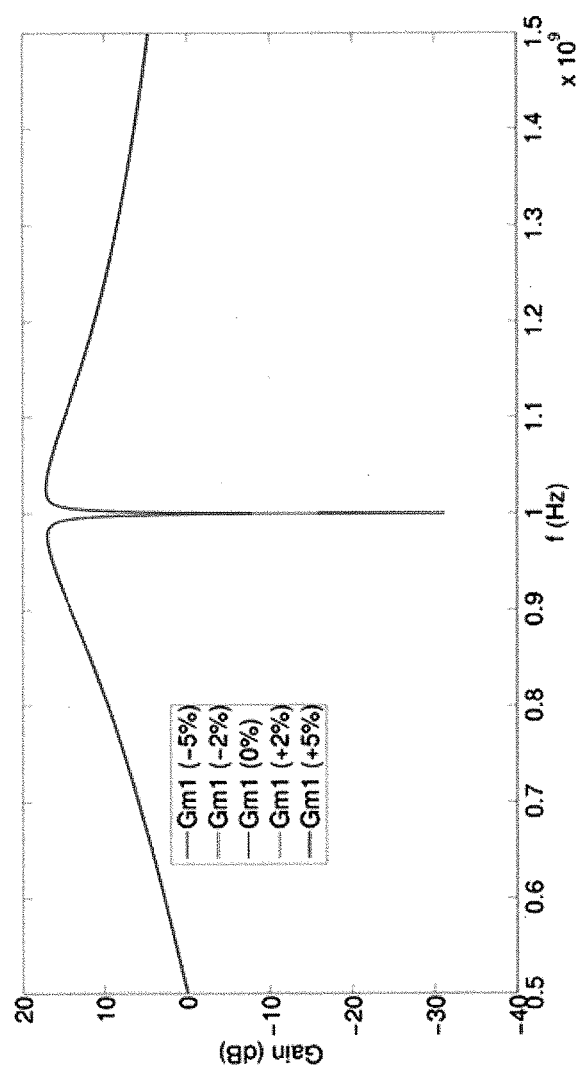
Figure 11:
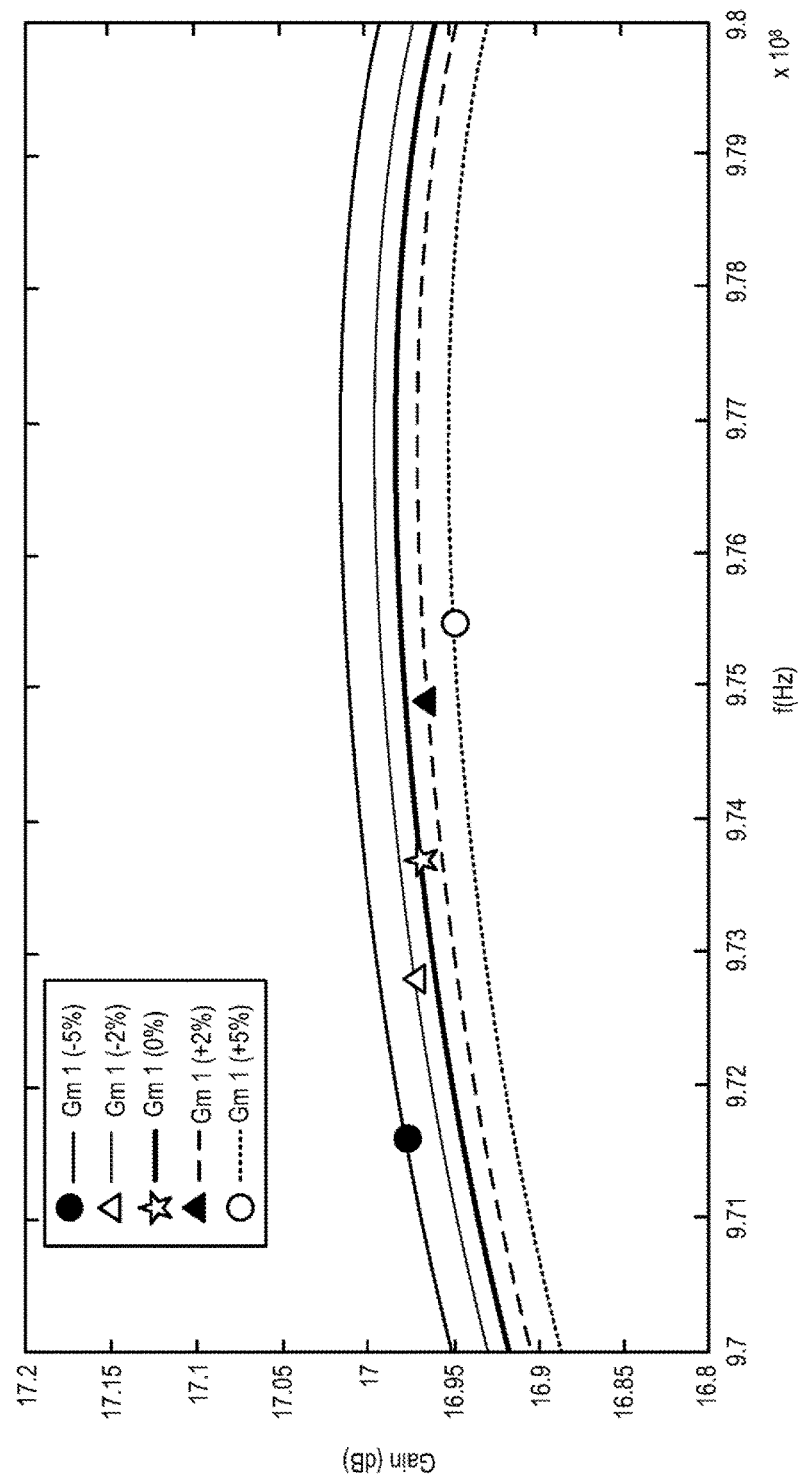

FIG. 10 shows the impact of varying the transconductance at 306 (Gm1) on the transfer function (see, for example, Equation 1 above, for the double band pass filter 300). As can be seen, the transconductance Gm1 variation may somewhat degrade the filtering at the central frequency (which in this example is 1 GHz). Even with a 5% variation, the attenuation is still about 24 dB in this example. FIG. 11 depicts a zoomed in portion of FIG. 10 around the low passband (which in this example is 975 MHz). The impact of the transconductance Gm1 variation on the in-band gain may be considered relatively low (for example, less than 0.1 dB).

Figure 12:
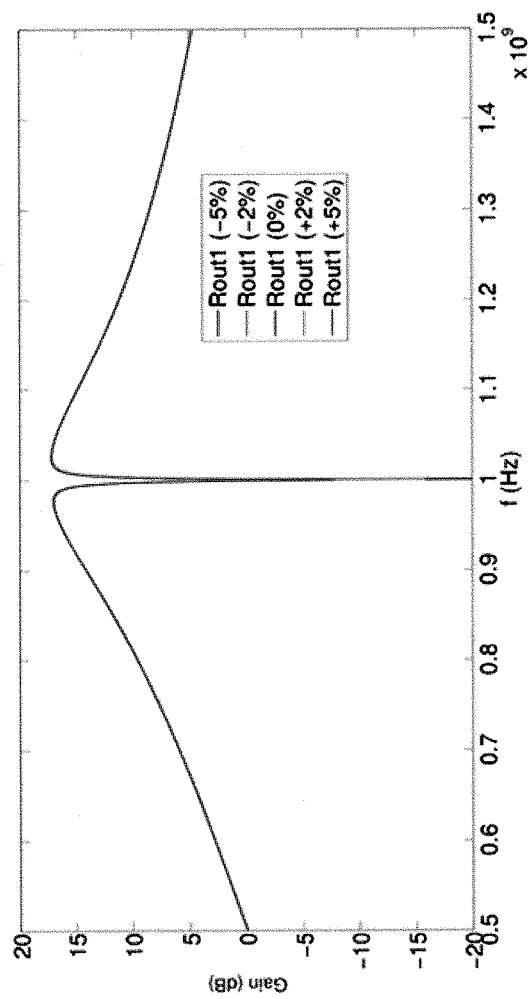
Figure 13:
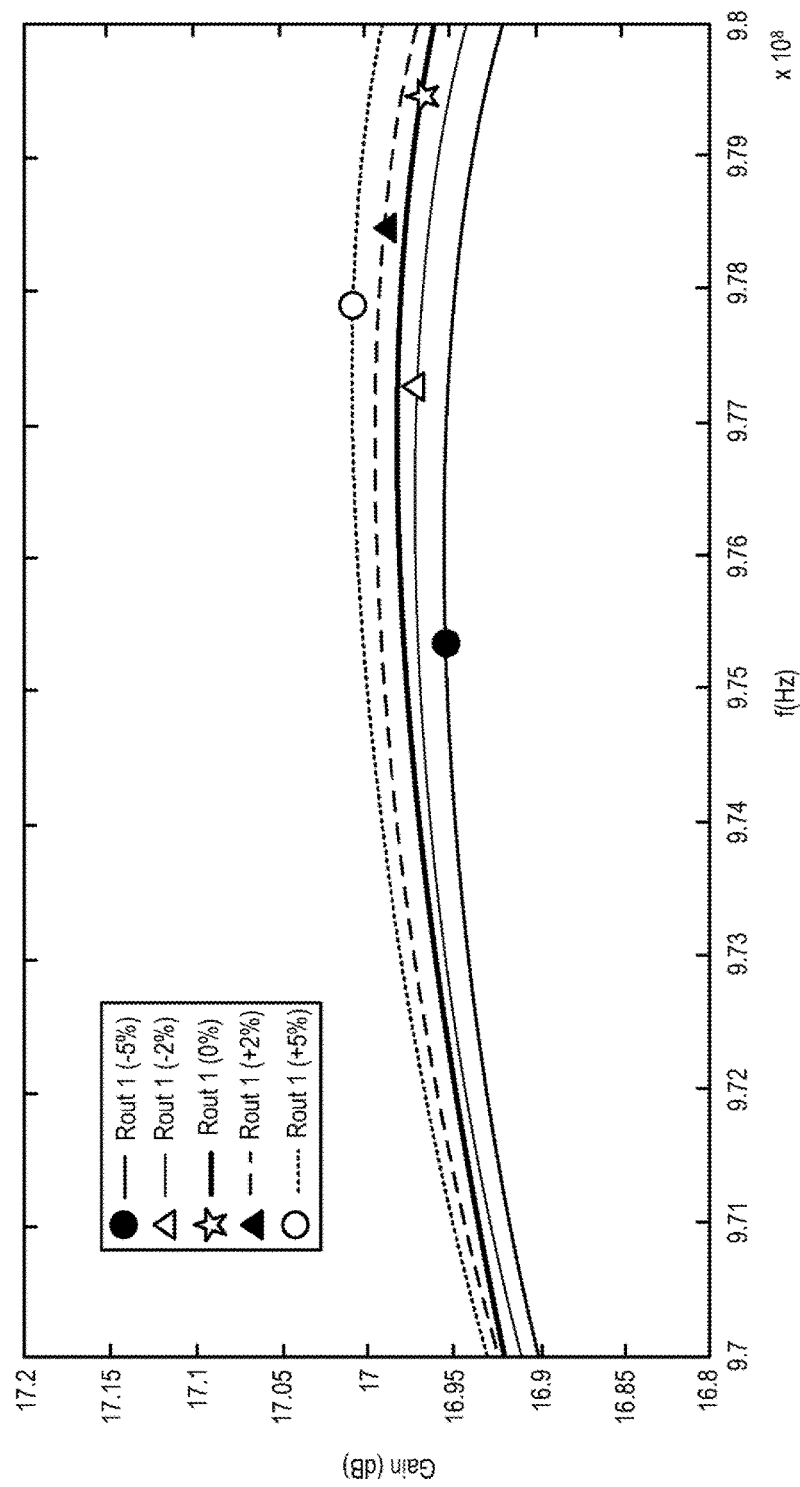

FIG. 12 shows the impact of varying the output resistance, Rout1. A change of Rout1 value may affect both the gain and the band (fb1) of the N-path filter 399A. The gain variation may result in a degradation of the filtering at for example 1 GHz as observed for the transconductance Gm1. The impact of fb1 change is a slight change of the frequency offset, foff. FIG. 13 depicts a zoomed in portion of FIG. 12 and shows the relatively low ripple.

Figure 14:
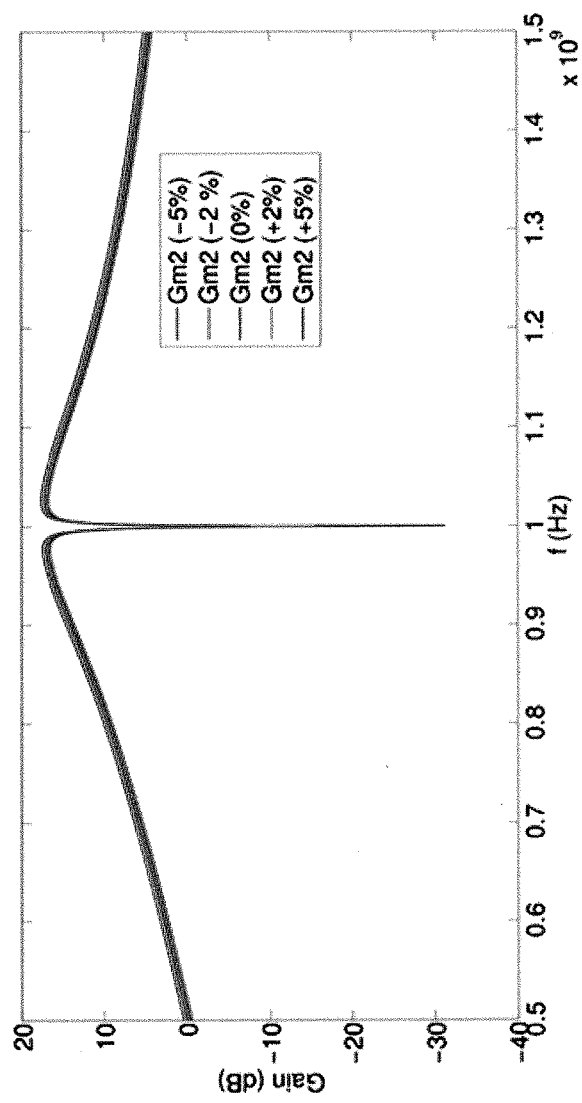
Figure 15:
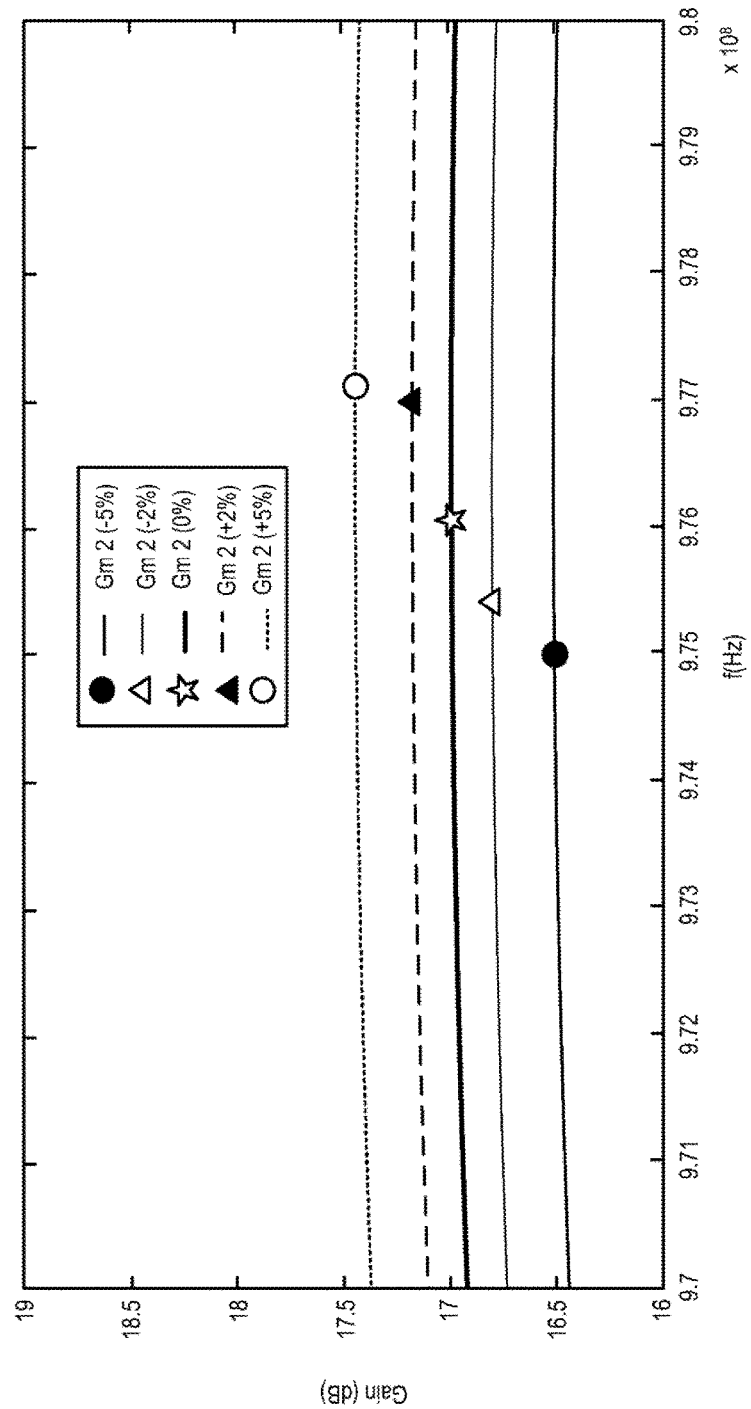

FIG. 14 shows the impact of varying transconductance Gm2. A gain mismatch between N-path filter 399A and N-path filter 399B may cause a degradation of the filtering at the central band, which in this example is around 1 GHz. The transconductance Gm2 variation may also cause a variation of the in-band gain in the frequency bands of interest. This gain may be substantially fixed by N-path filter 399B (a ±5% transconductance Gm2 variation may cause a ±0.42 dB variation, as shown in FIG. 15 where a zoomed in portion of FIG. 14 is shown).

Figure 16:
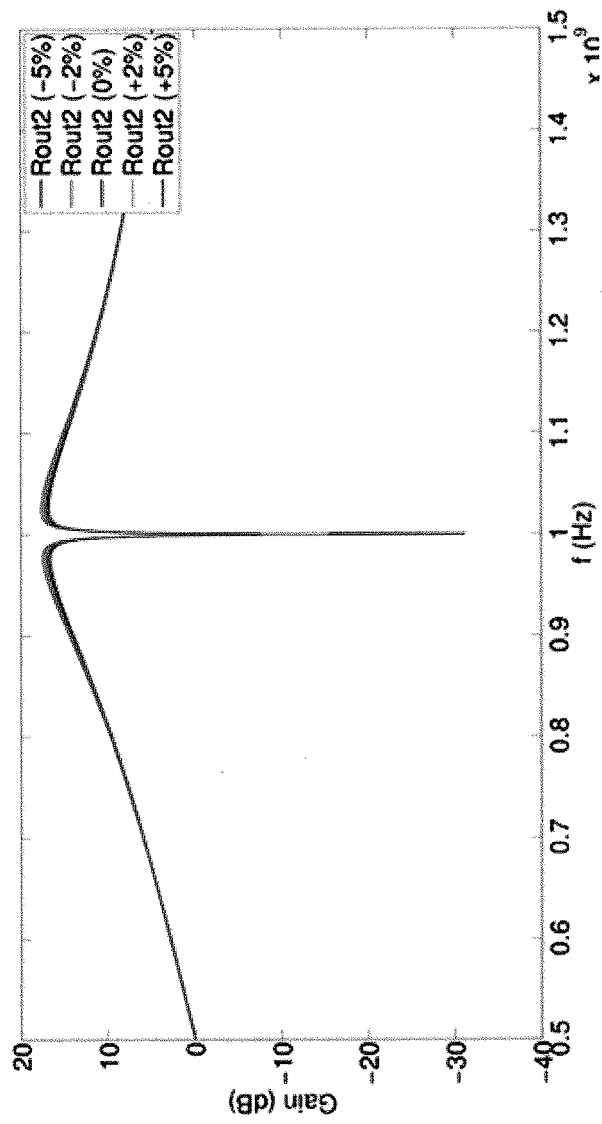
Figure 17:
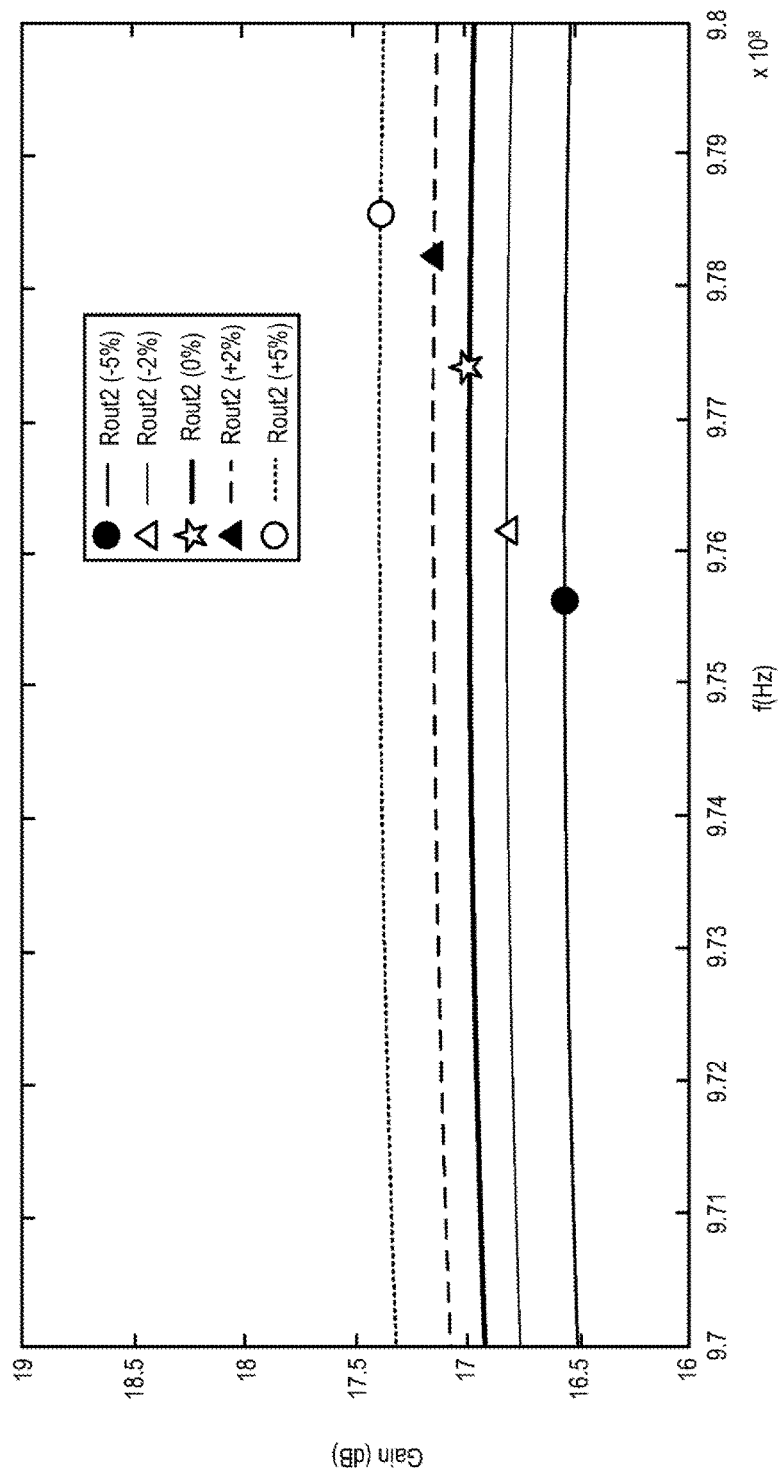

FIGS. 16 and 17 plot the effect of varying the output resistance, Rout2 at FIG. 3, to the gain of the second N-path filter 399B. Again, a degradation of central band filtering can be seen, and a variation of the gain in the useful band can be seen as well. The variation of the output resistance, Rout2, may, however, cause a negligible variation of the frequency offset, foff.

Figure 18:
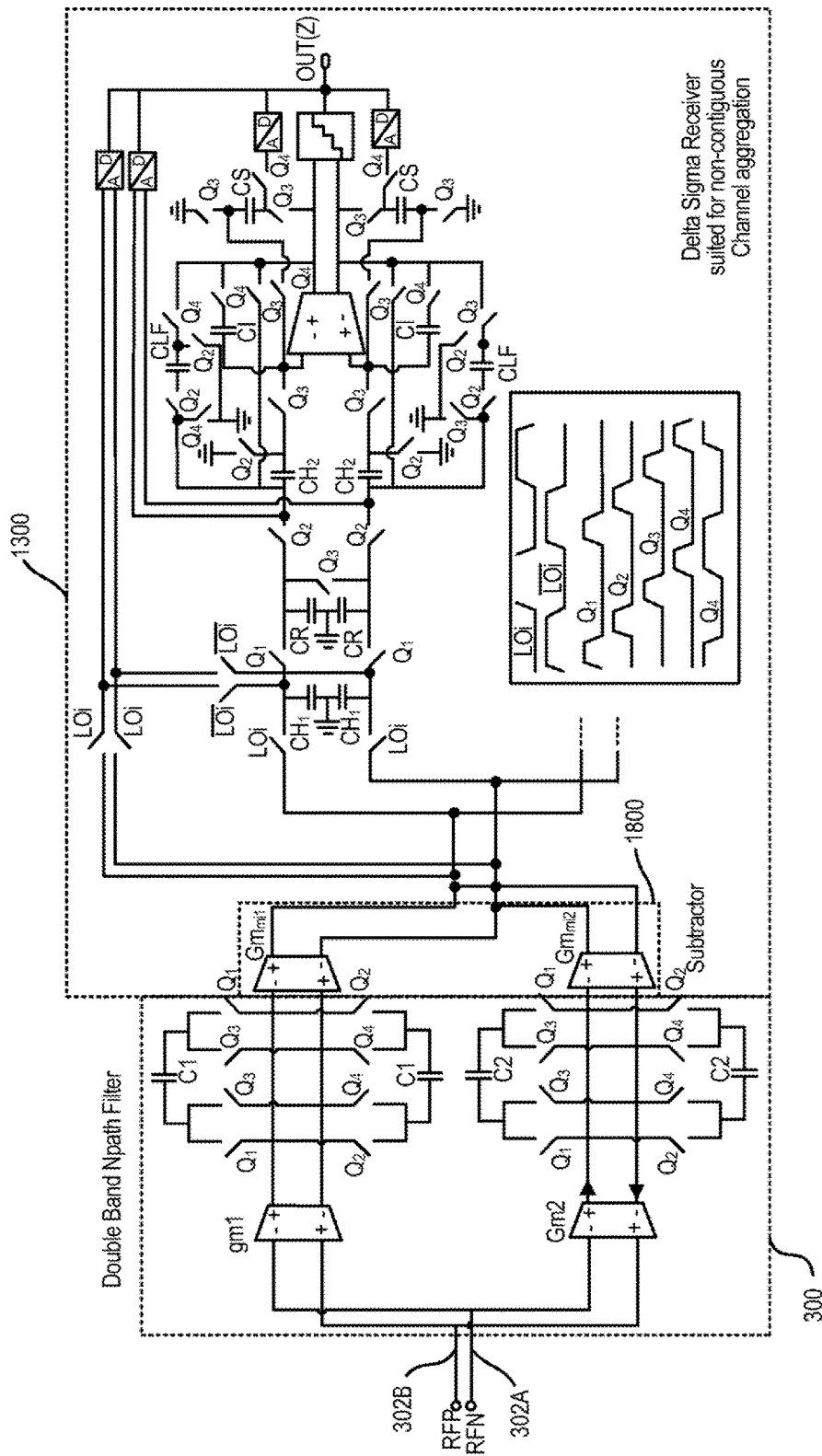
FIG. 18 depicts the two N-path filters of FIG. 3 coupled to the front end of a delta sigma receiver, in accordance with some example embodiments.

FIG. 18 depicts the apparatus 300 of FIG. 3 coupled to a delta sigma receiver 1300 configured to receive non-contiguous carrier aggregation signals, in accordance with some example embodiments. The RF signal input 302A-B is provided to the double bandpass filter 300, and the subtractor 1800 subtracts the output of the first N-path filter 399A from the second N-path filter 399B (for example, F2−F2), which can be performed in the current domain using the two transconductance amplifiers configured as a mixer $gm_{mix}$. The subtractor stage 1800 may also provide the input stage of the delta sigma receiver 1300. The sigma delta receiver system 1300 depicts one of the branches of sigma delta receivers (for example, a quadrature-phase (Q) branch, although similar circuitry may be used for the in-phase (I) branch as well), in accordance with some example embodiments. The sigma delta receiver system 1300 may also be implemented as continuous time delta sigma receivers as well.

Although FIG. 18 shows a current domain implementation of the subtractor, other implementations may be used as well (for example, a voltage-domain subtractor).

Figure 19:
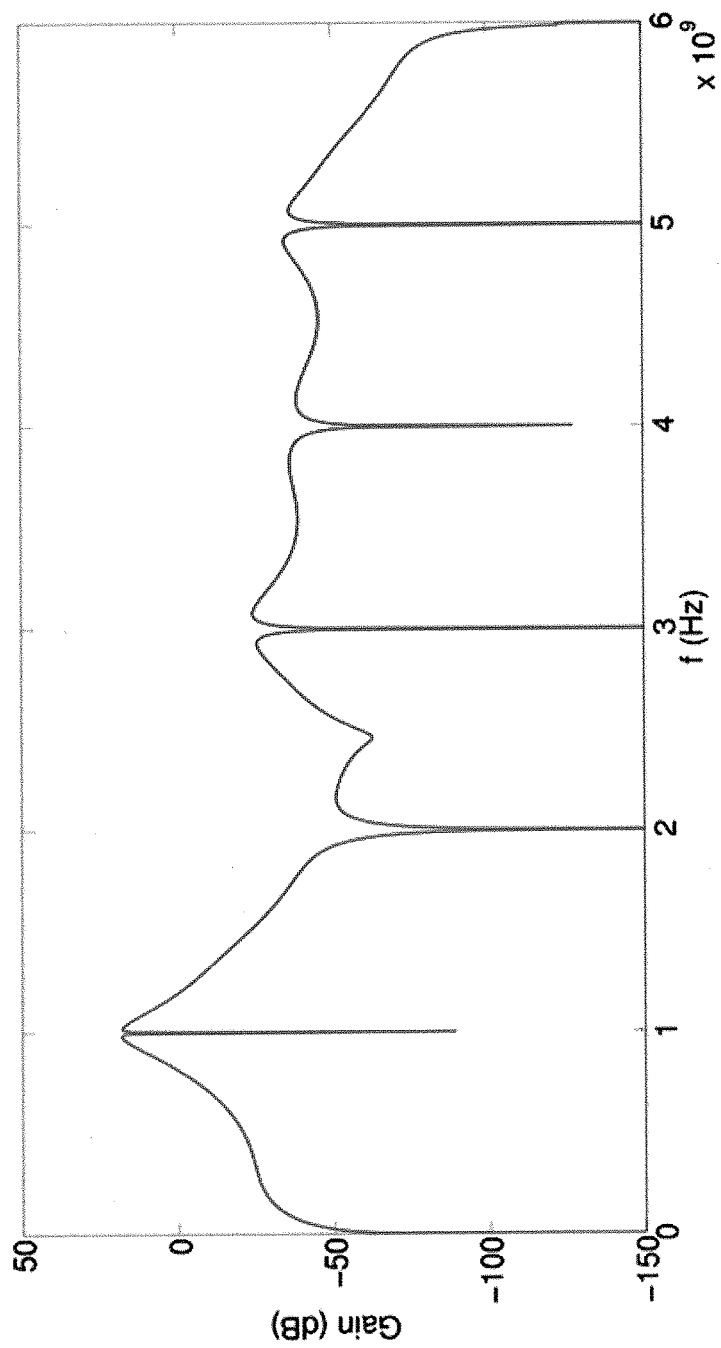
FIGS. 19-20 depict examples of simulated performance plots for the apparatus of FIG. 18, in accordance with some example embodiments.
Figure 20:
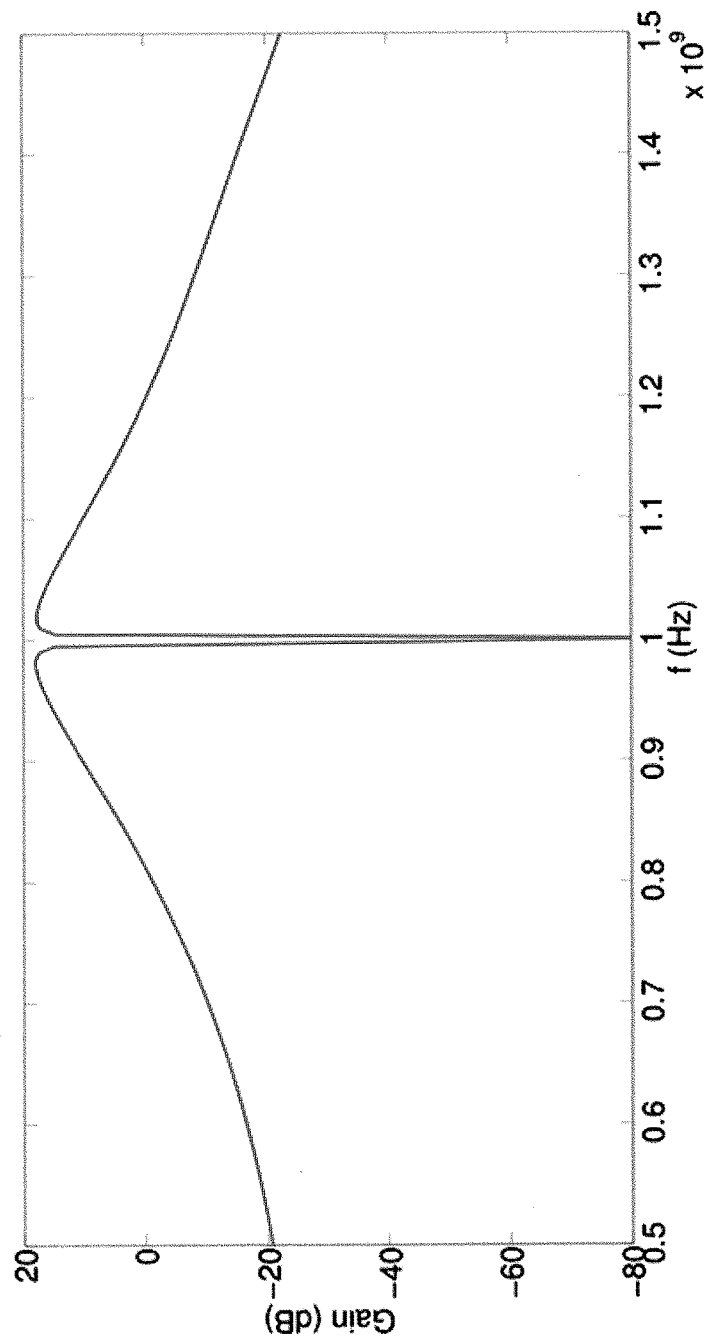

FIG. 19 shows a transfer function of the double bandpass filter 300 when integrated with the channel aggregation delta sigma receiver 1300, in accordance with some example embodiments. FIG. 20 depicts a zoomed in portion of the transfer function of FIG. 19 at around 1 GHz (which is the local oscillator frequency in this example) and a frequency offset, foff, of 25 MHz. FIGS. 19 and 20 show desired filtering required for the double bandpass filter 300 including a receiver such as a the delta sigma receiver. The receiver may be tunable as well.

In some example embodiments, the parallel N-path filters 300, sigma delta receiver 1300, and/or subtractor 1800 may be implemented in a user equipment, such as a mobile station, a mobile unit, a subscriber station, a wireless terminal, a tablet, a smart phone, a vehicle, a wireless plug-in accessory, and/or any other wireless device.

Figure 21:
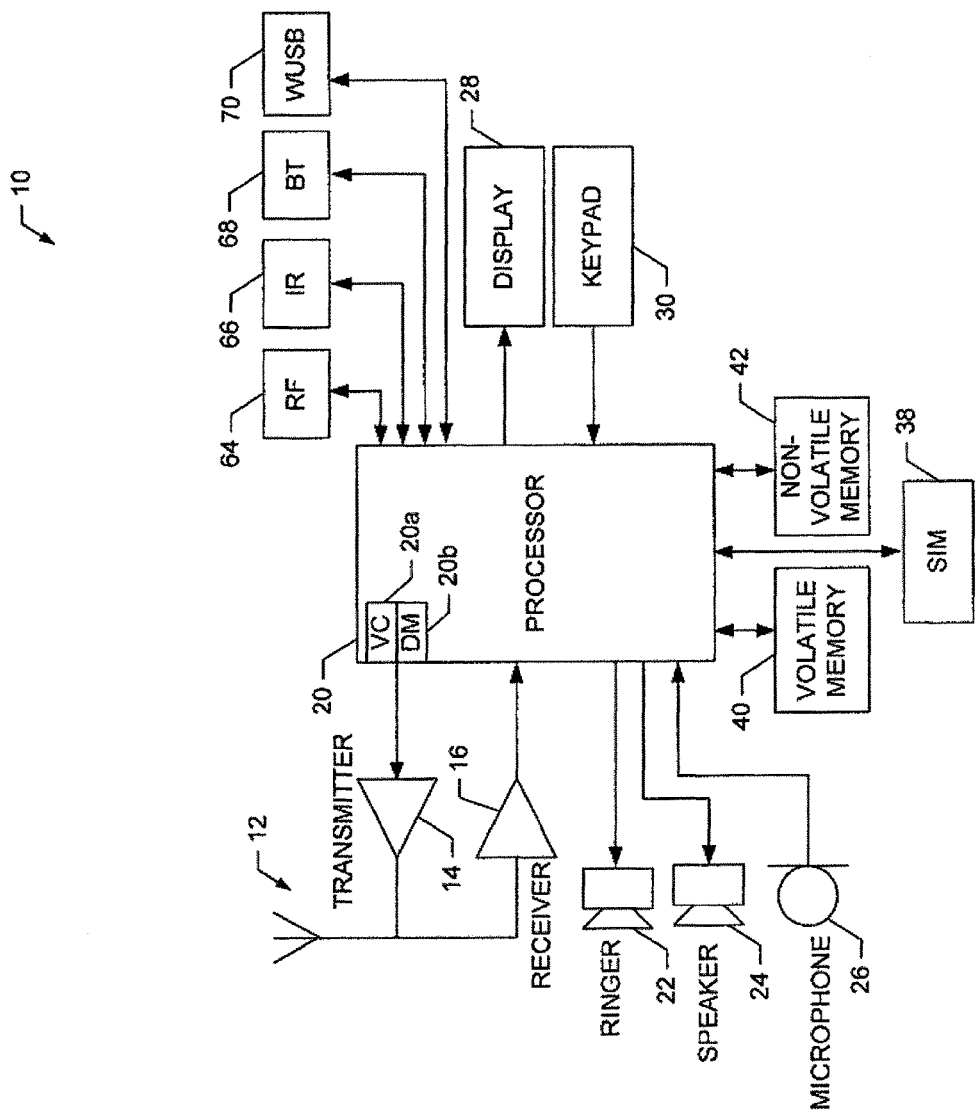
FIG. 21 depicts an example of a radio, in accordance with some example embodiments.

FIG. 21 depicts a block diagram of a radio 10 that may be used as user equipment including the sigma delta receiver, in accordance with some example embodiments.

The radio may include at least one antenna 12 in communication with a transmitter 14 and a receiver 16. Alternatively transmit and receive antennas may be separate.

In some example embodiments, receiver 16 may include parallel N-path filters 300, sigma delta receiver 1300, and/or subtractor 1800. Moreover, parallel N-path filters 300, sigma delta receiver 1300, and/or subtractor 1800 may be configured to receive a plurality of carrier aggregation carrier signals at different frequencies, such as a first carrier referred to as a primary cell and one or more secondary cell carriers.

The apparatus 10 may also include a processor 20 configured to provide signals to and receive signals from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 10 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Accordingly, although illustrated in FIG. 21 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, fifth-generation (5G) communication protocols, Internet Protocol Multimedia Subsystem (IMS) communication protocols (for example, session initiation protocol (SIP) and/or any subsequent revisions or improvements to these standards. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as Long Term Evolution (LTE), Evolved Universal Terrestrial Radio Access Network (E-UTRAN), and/or the like. Additionally, for example, the apparatus 10 may be capable of operating in accordance with 4G wireless communication protocols, such as LTE Advanced, LTE-Direct, LTE-Unlicensed, and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20a, an internal data modem (DM) 20b, and/or the like. Further, the processor 20 may include functionality to operate one or more software programs, which may be stored in memory. In general, processor 20 and stored software instructions may be configured to cause apparatus 10 to perform actions. For example, processor 20 may be capable of operating a connectivity program, such as a web browser. The connectivity program may allow the apparatus 10 to transmit and receive web content, such as location-based content, according to a protocol, such as wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 20 to receive data, such as a keypad 30 (which can be a virtual keyboard presented on display 28 or an externally coupled keyboard) and/or other input devices.

As shown in FIG. 21, apparatus 10 may also include one or more mechanisms for sharing and/or obtaining data. For example, the apparatus 10 may include a short-range radio frequency (RF) transceiver and/or interrogator 64, so data may be shared with and/or obtained from electronic devices in accordance with RF techniques. The apparatus 10 may include other short-range transceivers, such as an infrared (IR) transceiver 66, a Bluetooth™ (BT) transceiver 68 operating using Bluetooth™ wireless technology, a wireless universal serial bus (USB) transceiver 70, a Bluetooth™ Low Energy transceiver, a ZigBee transceiver, an ANT transceiver, a cellular device-to-device transceiver, a wireless local area link transceiver, and/or any other short-range radio technology. Apparatus 10 and, in particular, the short-range transceiver may be capable of transmitting data to and/or receiving data from electronic devices within the proximity of the apparatus, such as within 10 meters, for example. The apparatus 10 including the Wi-Fi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 10 may comprise memory, such as a subscriber identity module (SIM) 38, a removable user identity module (R-UIM), a eUICC, an UICC, and/or the like, which may store information elements related to a mobile subscriber. In addition to the SIM, the apparatus 10 may include other removable and/or fixed memory. The apparatus 10 may include avolatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus for performing functions of the user equipment configured with the sigma delta receiver disclosed herein. The memories may comprise an identifier, such as an international mobile equipment identification (IMEI) code, capable of uniquely identifying apparatus 10. The functions may include one or more of the user equipment operations disclosed with respect to the parallel N-path filters 300, sigma delta receiver 1300, subtractor 1800, and/or the like. In the example embodiment, the processor 20 may be configured using computer code stored at memory 40 and/or 42 to perform operations as disclosed herein with respect to parallel N-path filters 300, sigma delta receiver 1300, subtractor 1800, and/or the like.

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIG. 21, computer-readable medium may comprise a non-transitory computer-readable storage medium that may be any media that can contain or store the instructions for use by or in connection with an instruction execution system, apparatus, or device, such as a computer.

In some example embodiments, processor 20 (although a dedicated controller may be used as well) may be used to control the local oscillator of the N-path filters in order to adjust the center frequency of the filter. The processor 20 may also control the values of capacitors C1 and/or C2 in order to control the N-path filter bandwidth respectively. Moreover, the controller may configure the circuit to provide (or not provide) the subtractor as well as provide other processing (such as a combiner (or adder)). Further, the controller may adjust or tune the sigma delta receiver (or other receiver type) as well.

Without in any way limiting the scope, interpretation, or application of the claims appearing herein, a technical effect of one or more of the example embodiments disclosed herein may include a flexible system in which both the central frequency and the frequency offset between the channels can be reconfigured by adjusting the local oscillator frequency and the bandwidths of the filters. Without in any way limiting the scope, interpretation, or application of the claims appearing herein, a technical effect of one or more of the example embodiments disclosed herein may include a system that includes a single local oscillator to each of the N-path filters. Without in any way limiting the scope, interpretation, or application of the claims appearing herein, a technical effect of one or more of the example embodiments disclosed herein may include reductions in switch ON resistance on the out-of-band rejection of the filter.

The subject matter described herein may be embodied in systems, apparatus, methods, and/or articles depending on the desired configuration. For example, the base stations and user equipment (or one or more components therein) and/or the processes described herein can be implemented using one or more of the following: a processor executing program code, an application-specific integrated circuit (ASIC), a digital signal processor (DSP), an embedded processor, a field programmable gate array (FPGA), and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor, and may be implemented in a high-level procedural and/or object-oriented programming language, and/or in assembly/machine language. As used herein, the term "computer-readable medium" refers to any computer program product, machine-readable medium, computer-readable storage medium, apparatus and/or device (for example, magnetic discs, optical disks, memory, Programmable Logic Devices (PLDs)) used to provide machine instructions and/or data to a programmable processor, including a machine-readable medium that receives machine instructions. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. Moreover, the implementations described above may be directed to various combinations and subcombinations of the disclosed features and/or combinations and subcombinations of several further features disclosed above. Other embodiments may be within the scope of the following claims.

The different functions discussed herein may be performed in a different order and/or concurrently with each other. Furthermore, one or more of the above-described functions may be optional or may be combined. Although various aspects of the invention are set out in the independent claims, other aspects of the invention comprise other combinations of features from the described embodiments and/or the dependent claims with the features of the independent claims, and not solely the combinations explicitly set out in the claims. It is also noted herein that while the above describes example embodiments of the invention, these descriptions should not be viewed in a limiting sense. Rather, there are several variations and modifications, which may be made without departing from the scope of the present invention as, defined in the appended claims. The term "based on" includes "based on at least."

What is claimed is:

1. An apparatus comprising:
a first N-path filter configured with at least a first passband, wherein the first N-path filter is coupled to a radio frequency input port providing at least a first carrier aggregation signal, a second carrier aggregation signal, and an interfering signal, the first passband passing the interfering signal and suppressing the first carrier aggregation signal and the second carrier aggregation signal;
a second N-path filter configured with at least a second passband, wherein the second N-path filter is coupled to the radio frequency input port providing at least the first carrier aggregation signal, the second carrier aggregation signal, and the interfering signal, the second passband passing the first carrier aggregation signal, the second carrier aggregation signal, and the interfering signal; and
a combiner configured to subtract a first output of the first N-path filter from a second output of the second N-path filter in order to provide, as an output, the first carrier aggregation signal and the second carrier aggregation signal.

2. The apparatus of claim 1 further comprising:
a receiver configured to receive a combiner output, the receiver comprising a delta sigma receiver.

3. The apparatus of claim 1 further comprising:
at least one of a clock or a local oscillator coupled to the first N-path filter and the second N-path filter.

4. The apparatus of claim 1, wherein the apparatus is included in a user equipment.

5. The apparatus of claim 1, wherein the radio frequency input port is configured to receive at least a down converted signal at an intermediate frequency.

6. The apparatus of claim 1 further comprising:
a controller configured to vary at least one of a first capacitor coupled to a first N-path filter output or a second capacitor coupled to a second N-path filter output.

7. The apparatus of claim 6, wherein the varying of the first capacitor varies a bandwidth of the first N-path filter.

8. The apparatus of claim 6, wherein the controller is further configured to vary a clock frequency of at least one of the first N-path filter or the second N-path filter.

9. The apparatus of claim 8, wherein the varying of the clock frequency varies a center frequency at least one of the first passband of the first N-path filter or the second passband of the second N-path filter.

10. The apparatus of claim 1, wherein the first carrier aggregation signal comprises a primary cell carrier, wherein the second carrier aggregation signal comprises a secondary cell carrier, and wherein the first and second carrier aggregation signals are non-contiguous.

11. A method comprising:
receiving, at a radio frequency input port, at least a first carrier aggregation signal, a second carrier aggregation signal, and an interfering signal;
filtering, at a first N-path filter coupled to the radio frequency input port, the first carrier aggregation signal, the second carrier aggregation signal, and the interfering signal, wherein the first N-path filter is configured with at least a first passband, the first passband passing the interfering signal and suppressing the first carrier aggregation signal and the second carrier aggregation signal;
filtering, at a second N-path filter coupled to the radio frequency input port, the first carrier aggregation signal, the second carrier aggregation signal, and the interfering signal, wherein the second N-path filter is configured with at least a second passband, the second passband passing the first carrier aggregation signal, the second carrier aggregation signal, and the interfering signal; and subtracting, at a combiner, a first output of the first N-path filter from a second output of the second N-path filter in order to provide, as an output, the first carrier aggregation signal and the second carrier aggregation signal.

12. The method of claim 11 further comprising:
receiving, at a receiver, a combiner output, the receiver comprising a delta sigma receiver.

13. The method of claim 11 further comprising:
providing, by at least one of a clock or a local oscillator, a clock signal to the first N-path filter and the second N-path filter.

14. The method of claim 11, wherein the first N-path filter, the second N-path filter, and the combiner are included in a user equipment.

15. The method of claim 11, wherein the radio frequency input port is configured to receive at least a down converted signal at an intermediate frequency.

16. The method of claim 11 further comprising:
varying, by a controller, at least one of a first capacitor coupled to a first N-path filter output or a second capacitor coupled to a second N-path filter output.

17. The method of claim 16, wherein the varying of the first capacitor varies a bandwidth of the first N-path filter.

18. The method of claim 16, wherein the controller is further configured to vary a clock frequency of at least one of the first N-path filter or the second N-path filter.

19. The method of claim 16, wherein the varying of the clock frequency varies a center frequency at least one of the first passband of the first N-path filter or the second passband of the second N-path filter.

20. The method of claim 11, wherein the first carrier aggregation signal comprises a primary cell carrier, wherein the second carrier aggregation signal comprises a secondary cell carrier, and wherein the first and second carrier aggregation signals are non-contiguous.

* * * * *